United States Patent [19]
Iwami et al.

[11] Patent Number: 5,743,990
[45] Date of Patent: Apr. 28, 1998

[54] THIN LAMINATE REMOVAL PROCESS TOOLING AND METHOD

[75] Inventors: Craig Iwami, Dana Point; Cunegundis T. Cura, Stanton; Vincente Soto, Riverside; Seth Greiner, Costa Mesa, all of Calif.

[73] Assignee: Hughes Electronics, Los Angeles, Calif.

[21] Appl. No.: 755,988

[22] Filed: Nov. 25, 1996

[51] Int. Cl.$^6$ .................................................. B32B 35/00
[52] U.S. Cl. ...................... 156/344; 156/584; 29/402.03; 29/426.5
[58] Field of Search ...................... 156/230, 241, 156/344, 584; 29/402.03, 426.5

[56] References Cited

U.S. PATENT DOCUMENTS

| | | | |
|---|---|---|---|
| 3,943,023 | 3/1976 | Weingrad | 156/230 |
| 4,640,735 | 2/1987 | Murray et al. | 156/584 |
| 5,460,683 | 10/1995 | Beasley, Jr. et al. | 156/584 |

FOREIGN PATENT DOCUMENTS

| | | | |
|---|---|---|---|
| 1131813 | 6/1962 | Germany | 156/230 |
| 55-156085 | 12/1980 | Japan | 156/230 |
| 57-14090 | 1/1982 | Japan | 156/344 |
| 62-152707 | 7/1987 | Japan | 156/344 |

*Primary Examiner*—Mark A. Osele
*Attorney, Agent, or Firm*—Leonard A. Alkov; William C. Schubert; Glenn H. Lenzen, Jr.

[57] ABSTRACT

Laminate or DECAL removal tooling and method for removing an interconnect substrate, such as a thin DECAL-like structure from a surface of a printed wiring board, heat sink, or other rigid substrate or structure. The tooling may be used to remove a thin laminate, such as a polyimide decal, from pattern metallized and pattern unmetallized polyimide, or ceramic metallized substrates, or thermally conductive heat exchangers. A cylindrical thermode is heated and secured with a layer of adhesive to the thin DECAL-like interconnect structure. The thermode has a non slip drive mechanism attached thereto that is coupled to a drive mechanism. The thermode is moved by the drive mechanism to peel the thin laminate from the rigid substrate without damage. This allows a new DECAL-like structure to be applied to the rigid substrate.

8 Claims, 1 Drawing Sheet

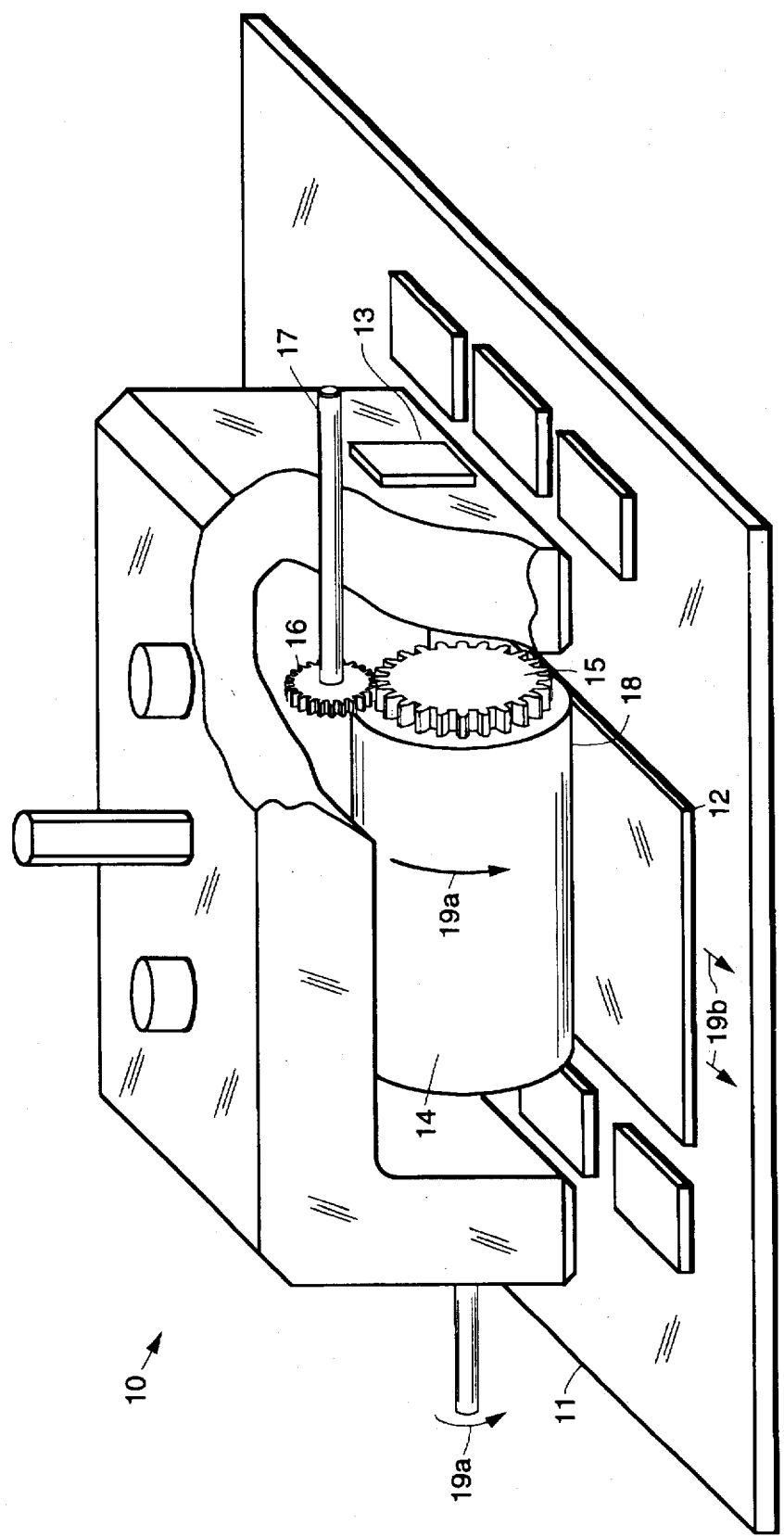

THIN LAMINATE REMOVAL PROCESS TOOLING AND METHOD

BACKGROUND

The present invention relates generally to apparatus for removing a thin and pliable interconnect substrate or DECAL (Direct Electrical Connection Array Laminate) substrate from a rigid backplane structure generally used as a heat sink or printed wiring board motherboard. More particularly, the present invention improves the process and tooling for removing these thin and pliable interconnects or DECAL-like substrates from an underlying rigid structure.

As demands to improve performance and reduce costs of systems manufactured by the assignee of the present invention increase, higher density electronic packaging is needed. This has resulted in alternative high density packaging developed to support these requirements. DECAL and/or patch interconnect technology provides an alternative less costly packaging solution for very dense interconnect substrates that may be incorporated into systems.

This packaging technology also provides several advantages for systems in which it is used. These advantages include improved thermal conductivity, flexible packaging, significant weight reduction, the technology is also adaptable to standard manufacturing methods, it reduces the level of interconnect layers, and reduces interconnect thickness.

Thin interconnect substrates, such as a polyimide DECALs (Direct Electrical Connection Array Laminate), for example, have heretofore been applied to surfaces of printed wiring boards as a daughter board, thus providing higher packaging density to accommodate higher complexity semiconductors. Also, to improve thermal performance, a DECAL or patch interconnect substrate can be mounted directly to a heat exchanger.

Typically, removal of these thin interconnect substrates from surfaces of printed wiring boards could not be successfully performed due to the lack of tooling and inadequate processing techniques. "Knife blade" type tooling was initially used to remove the DECAL-like substrates. During this procedure, either the DECAL-like substrate, the rigid structure beneath the DECAL substrate and/or neighboring semiconductor devices were damaged. Therefore, the DECAL substrate would have to be replaced. Consequently, cost savings or benefits could not be realized unless the DECAL-like substrate structures could be successfully removed and replaced. Furthermore, without precision equipment and tooling that produces consistent, repeatable processes, DECAL packaging technology could not be used in production.

Accordingly, it is an objective of the present invention to provide for improved tooling and processes that may be used to remove thin interconnect substrates or DECAL-like substrate structures from an underlying rigid structure such as a heat sink or printed wiring board.

SUMMARY OF THE INVENTION

To meet the above and other objectives, the present invention provides for thin DECAL-like substrate structure removal tooling and method that removes thin DECAL-like interconnect substrates from underlying rigid structures, such as heat exchangers or printed wiring boards, for example. The tooling provides "turn-key" apparatus for removing a thin DECAL-like substrate structure, such as thin film metallizations on polyimide, ceramic, and fine pitch laminates, for example from rigid structures. The tooling is used in conjunction with existing component removal tooling that has heretofore been used to remove faulty highly complex semiconductor integrated circuit devices from a variety of high density substrate structures by heating and then applying torque forces to remove the faulty devices.

More particularly, the DECAL-like substrate structure removal process tooling uses a rotating cylindrical thermode in conjunction with a thermoset or thermoplastic adhesive that is heated to attach the thermode to the DECAL-like structure. Heat derived from a heating element of the component removal equipment is applied to the thermode and adhesive to secure the thermode to the thin DECAL-like structure. The thermode, which incorporates a non-slip drive mechanism, applies maximum peel force to the leading edge of the peeled DECAL-like structure, causing it to release from the heat exchanger or printed wiring board. This action removes the DECAL-like structure from the heat exchanger or printed wiring board without causing any damage to the underlying substrate materials and/or neighboring semiconductor devices. Also, the use of the tooling is consistent and is operator-independent. Production level removal of DECAL-like structures cannot be performed without the use of the tooling of the present invention.

The present removal tooling offers several advantages. First, it does not damage the underlying base or its metallization patterns which may be beneath the DECAL-like structure, which allows the base to be re-used. Second, it allows the removal process to be consistently and repeatably performed each time it is used.

The present removal process tooling may be used in conjunction with chip on-board (COB) assembly processing and environmental protection of bare components on a variety of substrate types. The use of DECAL-like structures allow replacement of obsolete components such as memory devices, and the like, without expensive substrate re-design. Many components become obsolete within eighteen months of market introduction. Without the present removal tooling, DECAL-like and patch like substrate interconnect structures cannot be used in production. Significant cost avoidance can be immediately realized while incorporating fine line printed wiring boards and high density multi-layer interconnect substrates. Initially, the DECAL-like and patch interconnect product applications can be immediately transitioned to provide product configurations and use.

The present invention may be used with printed wiring boards made for use in automotive, high-reliability space, telecommunications and military applications. Application and removal of thin laminates like DECAL-like structure, together with chip-on-board assembly processing, allows design and manufacturing flexibility for numerous military and commercial programs, both airborne and ground-based.

BRIEF DESCRIPTION OF THE DRAWING

The various features and advantages of the present invention may be more readily understood with reference to the following detailed description taken in conjunction with the accompanying drawing which illustrates process tooling in accordance with the principles of the present invention that may be used to remove thin laminates, or DECAL-like structures, from surfaces of printed wiring boards, or other base structure or material.

DETAILED DESCRIPTION

Referring to the drawing figure, it shows tooling 10 that may be used to remove a thin laminate DECAL-like structure 12 or other interconnect substrate 12, from a surface of a base structure 11 or material 11, such as a heat exchanger 11 or printed wiring board 11, for example. The tooling 10 provides a means for removing the thin laminate DECAL-like structure 12, from a pattern metallized or pattern unmetallized polyimide or ceramic printed wiring board 11, for example.

The process tooling 10 comprises a rotating cylindrical thermode 14 that is disposed adjacent to a surface of the thin laminate DECAL-like structure 12. The cylindrical thermode 14 has a non-slip drive mechanism 15, such as a fixed gear 15, for example, attached thereto. The non slip drive mechanism 15 is coupled to a drive sprocket 16, for example, which is rotated by a drive mechanism 17. The drive mechanism 17 rotates the drive sprocket 16, which in turn rotates the non-slip drive mechanism 15, as indicated by the arrow 19a, which in turn moves or translates the thermode 14 along the surface of the printed wiring board 11 and DECAL-like structure 12, as indicated by the arrows 19b. The cylindrical thermode 14 is attached to the surface of the thin laminate DECAL structure 12 using a layer of adhesive 18, such as pre-impregnated thermosetting epoxy, for example.

A heating element 13 is coupled to the cylindrical thermode 14 and provides heat thereto to elevate the temperature thereof to a predetermined temperature. The heating element 13 heats the cylindrical thermode 14 which in turn heats the layer of adhesive 18 to the predetermined temperature. A typical predetermined temperature is around 165 degrees Celsius for about ten minutes using a typical quick curing thermosetting epoxy adhesive, for example.

The heated layer of adhesive 18 is then allowed to cool to secure the thermode 14 to the surface of the thin laminate like DECAL structure 12. Once the layer of adhesive 18 cools, the thermode 14 is secured to the thin laminate like DECAL structure 12. Then, actuation of the drive mechanism 17 rotates the non-slip drive mechanism 15 and drive sprocket 16, which rotates the thermode 14 to peel the thin laminate like DECAL structure 12 and therefore remove it from the rigid structure 11 on which it is mounted.

Thus, unique process tooling that may be used to remove thin DECAL laminates from surfaces of printed wiring boards and other rigid structures has been disclosed. It is to be understood that the described embodiment is merely illustrative of some of the many specific embodiments which represent applications of the principles of the present invention. Clearly, numerous and varied other arrangements may be readily devised by those skilled in the art without departing from the scope of the invention.

What is claimed is:

1. A method of removing a thin interconnect substrate from a surface of a base structure, said method comprising the steps of:

disposing a cylindrical thermode adjacent to a surface of the thin interconnect substrate wherein the thin interconnect substrate comprises a polyimide interconnect substrate;

attaching a non-slip drive mechanism to the cylindrical thermode;

disposing a layer of adhesive between the cylindrical thermode and the surface of the thin interconnect substrate that secures the cylindrical thermode to the surface of the thin interconnect substrate;

heating the thermode and layer of adhesive to secure the thermode to the thin interconnect susbstrate; and rotating the non-slip drive mechanism and cylindrical thermode to translate the thermode along the surface of the base structure and interconnect substrate, to apply a peel force to the interconnect substrate to peel the interconnect substrate from the base structure.

2. The method of claim 1 wherein the base structure comprises a pattern metallized polyimide printed wiring board.

3. The method of claim 1 wherein the base structure comprises a pattern metallized ceramic printed wiring board.

4. The method of claim 1 wherein the base structure comprises an unmetallized polyimide printed wiring board.

5. The method of claim 1 wherein the base structure comprises an unmetallized ceramic printed wiring board.

6. The method of claim 1 wherein the non-slip drive mechanism comprises a fixed gear.

7. The method of claim 1 wherein the layer of adhesive comprises thermosetting epoxy.

8. The method of claim 7 wherein the thermode and layer of adhesive is heated to a temperature of about 165 degrees Celsius for about ten minutes.

* * * * *